(12) United States Patent
Takahashi

(10) Patent No.: US 7,868,470 B2
(45) Date of Patent: Jan. 11, 2011

(54) SEMICONDUCTOR CHIP PACKAGE AND MULTICHIP PACKAGE

(75) Inventor: Norio Takahashi, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 0 days.

(21) Appl. No.: 12/458,808

(22) Filed: Jul. 23, 2009

(65) Prior Publication Data

US 2009/0309205 A1   Dec. 17, 2009

Related U.S. Application Data

(62) Division of application No. 10/842,486, filed on May 11, 2004, now Pat. No. 7,576,431.

(30) Foreign Application Priority Data

Dec. 25, 2003   (JP)   .............................. 2003-429531

(51) Int. Cl.
H01L 23/48 (2006.01)
H01L 23/52 (2006.01)

(52) U.S. Cl. .................. 257/786; 257/773; 257/777; 257/686; 257/784; 257/666; 257/E23.141

(58) Field of Classification Search ................ 257/786, 257/773, 777, 686, 784, 666, E23.141
See application file for complete search history.

(56) References Cited

U.S. PATENT DOCUMENTS

| | | | |
|---|---|---|---|
| 6,104,084 A * | 8/2000 | Ishio et al. .................. 257/666 |
| 6,239,496 B1 * | 5/2001 | Asada ......................... 257/777 |
| 6,376,904 B1 | 4/2002 | Haba et al. |
| 6,414,381 B1 | 7/2002 | Takeda |
| 6,569,709 B2 | 5/2003 | Derderian |
| 6,621,169 B2 * | 9/2003 | Kikuma et al. ............... 257/780 |
| 6,664,644 B2 * | 12/2003 | Morozumi .................. 257/777 |
| 6,836,002 B2 * | 12/2004 | Chikawa et al. ............. 257/666 |
| 6,885,093 B2 | 4/2005 | Lo et al. |
| 6,965,160 B2 | 11/2005 | Cobbley et al. |
| 2001/0031513 A1 | 10/2001 | Masuda et al. |
| 2002/0096755 A1 | 7/2002 | Fukui et al. |
| 2002/0195697 A1 | 12/2002 | Mess et al. |

FOREIGN PATENT DOCUMENTS

| | | | |
|---|---|---|---|
| JP | 2001007278 A | 1/2001 |
| JP | 2001-196529 A | 7/2001 |
| JP | 2001-298150 A | 10/2001 |
| JP | 2002-110898 A | 4/2002 |

* cited by examiner

*Primary Examiner*—Nitin Parekh
(74) *Attorney, Agent, or Firm*—Rabin & Berdo, P.C.

(57) ABSTRACT

The present invention provides a multichip package wherein a plurality of semiconductor chip packages (100) in each of which first electrode pads (16a) provided in a main surface of a semiconductor chip, and first bonding pads (20a) and first central bonding pads (18a) formed in an upper area of the main surface are respectively electrically connected by first redistribution wiring layers (24) in a one-to-one correspondence relationship, and second electrode pads (17b), and second bonding pads (22b) and second central bonding pads (18b) formed in an upper area of the main surface are respectively electrically connected by second redistribution wiring layers (26) in a one-to-one correspondence relationship, are stacked on one another.

5 Claims, 12 Drawing Sheets

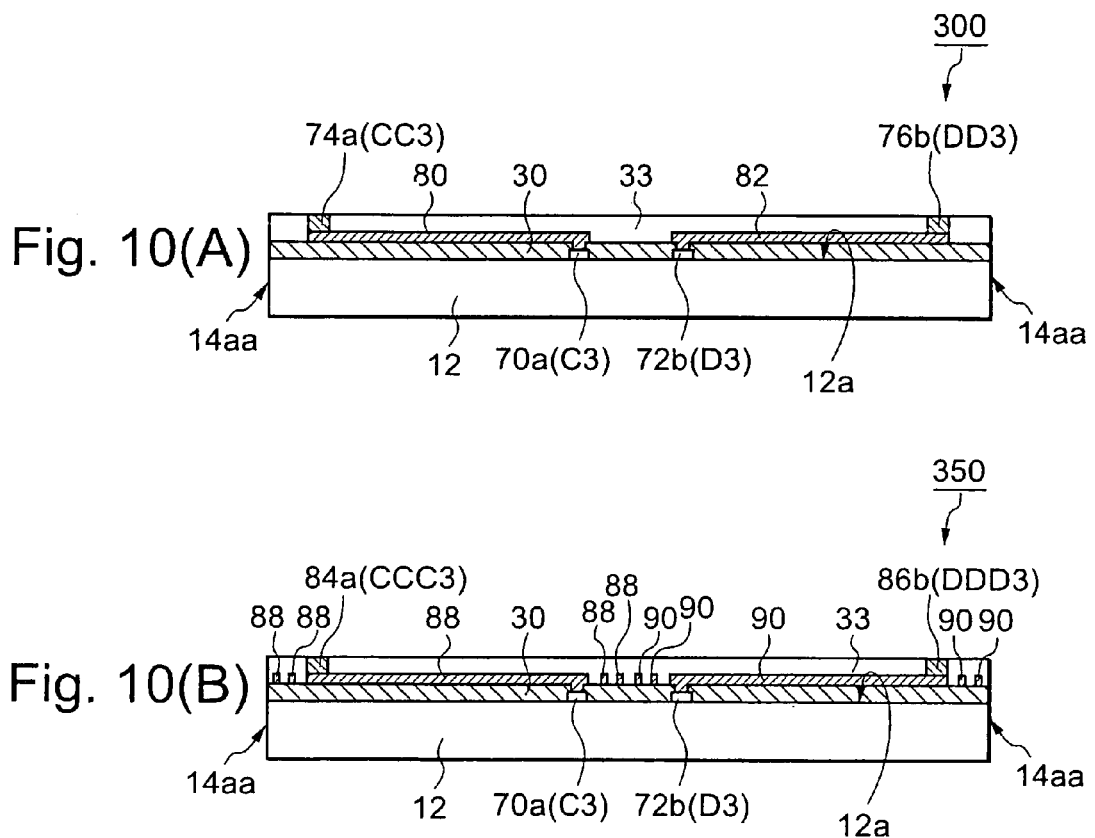

SEMICONDUCTOR CHIP PACKAGE AND MULTICHIP PACKAGE

This is a Divisional of U.S. application Ser. No.: 10/842,486, filed May 11, 2004, the subject matter of which is incorporated herein by reference.

BACKGROUND OF THE INVENTION

1. Field of the Invention

The present invention relates to a semiconductor chip package and a multichip package equipped with a plurality of the semiconductor chip packages.

This is counterpart of and claims priority to Japanese Patent Application No. 429531/2003 filed on Dec. 25, 2003, which is herein incorporated by reference.

2. Description of the Related Art

There has been known a semiconductor chip stack type package wherein a plurality of semiconductor chips are laminated or stacked on one another in one package in their thickness direction with the aim of carrying out high-density packaging based on multifunctioning of a semiconductor device.

As one example of such a semiconductor chip laminated package, may be mentioned, a stack type multichip package. The stack type multichip package has a configuration wherein a plurality of semiconductor chips are mounted on a substrate in a state of being stacked or laminated thereon in their thickness direction, and electrode pads of the respective semiconductor chips and electrical connecting portions on the substrate are respectively electrically connected by wire bonding.

As such a stack type multichip package, there is known a configuration wherein electrode pads of a certain semiconductor chip are provided as relay electrode pads for relaying to electrode pads of other semiconductor chip in order to electrically connect a semiconductor chip and a substrate spaced away from each other beyond a connectable range by wire bonding (see, for example, a patent document 1).

There is also known a configuration wherein with a view toward improving productivity of a semiconductor chip laminated package, for example, a plurality of semiconductor chips each having the same structure and function are stacked on one another with being shifted stepwise, and exposed electrode pads and leads of the respective semiconductor chips are electrically connected to one another by wire bonding (see, for example, a patent document 2).

Further, there is known a configuration wherein in order to laminate or stack two semiconductor chips different from each other in terms of their outer sizes and positions of bonding pads, a wiring sheet formed with wires on its surface side is interposed between the two semiconductor chips (see, for example, a patent document 3).

Moreover, there is known a configuration wherein the shapes of electrode pads of a semiconductor chip disposed on the lower side near conductor patterns formed on a substrate, of a plurality of laminated semiconductor chips are of rectangular shapes larger than those of normal electrode pads, and these electrode pads are formed along the peripheral edge of the semiconductor chip. Bonding wires electrically connected to their corresponding electrode pads of the semiconductor chip on the upper side and bonding wires connected to their corresponding electrode pads on the substrate side are respectively connected to the electrode pads each formed to such a larger size (see, for example, a patent document 4).

Patent Document 1
Japanese Unexamined Patent Publication No. 2001-196529
Patent Document 2
Japanese Unexamined Patent Publication No. 2001-298150
Patent Document 3
Japanese Unexamined Patent Publication No. 2001-7278
Patent Document 4
Japanese Unexamined Patent Publication No. 2002-110898

However, the conventional stack type multichip package was accompanied by problems to be described below.

In a structure in which a plurality of semiconductor chips are laminated or stacked with being shifted stepwise, for example, the lower side of a semiconductor chip that protrudes in visor form is placed in a state of being not supported by other semiconductor chip.

Therefore, there may be a case in which when wire bonding is effected onto the semiconductor chip that protrudes in visor form, stress is applied to a root or basal portion of such a visored portion because the bending strength of the semiconductor chip is weak, and hence the basal portion of the visored portion of the semiconductor chip breaks.

There may be a case in which since the bending strength of the semiconductor chip is weak, the force of bonding between electrode pads and bumps becomes insufficient upon bonding, thus resulting in deterioration in package reliability.

There may be a case in which since the bending strength of each semiconductor chip is weak upon sealing the semiconductor chips stacked on the substrate with a resin, cracks occur in the semiconductor chips due to stress concentration caused by a filler contained in a sealing or encapsulating material.

Further, when the semiconductor chips and the leads or substrate are respectively directly connected by bonding wires, the bonding wires become long in length.

As a result, the bonding wires are deformed due to flowability of an encapsulating resin or the like for sealing each semiconductor chip, so that so-called flowage of wires occurs. Consequently, there may be cases in which the wires are brought into contact with one another, thus causing malfunctions such as a short, breaking, etc.

Therefore, there has been proposed a method of, in order to avoid such malfunctions developed due to the wire's flow, making wires different in length from one another as viewed in the direction of package's height and three-dimensionally avoiding contact among the wires. Since, however, the thickness of the package increases in such a case, the present method is not fit for thinning of the package.

SUMMARY OF THE INVENTION

With the foregoing problems in view, it is a principal object of the present invention to provide a multichip package having reliability higher than ever and a semiconductor chip package that constitutes the multichip package.

According to one aspect of the present invention, for achieving the above object, there is provided a semiconductor chip package, comprising:

a semiconductor chip having a rectangular main surface;

a first electrode pad group provided on the main surface in parallel along a first side defining the main surface, the first electrode pad group including a plurality of first electrode pads;

a second electrode pad group provided on the main surface in parallel along a second side defining the main surface and opposite to the first side, the second electrode pad group including a plurality of second electrode pads;

a central bonding pad group provided parallel to the first electrode pad group, in an area of the main surface, lying between the first and second electrode pad groups and at positions near the first electrode pad group, the central bonding pad group including a plurality of first central bonding pads respectively corresponding to the first electrode pads and a plurality of second central bonding pads respectively corresponding to the second electrode pads;

a first bonding pad group provided in an area of the main surface, which is placed between the first electrode pad group and the first side, the first bonding pad group including a plurality of first bonding pads respectively provided corresponding to the first electrode pads in parallel with the first side;

a second bonding pad group provided in an area of the main surface, which is placed between the second electrode pad group and the second side, the second bonding pad group including a plurality of second bonding pads respectively provided corresponding to the second electrode pads in parallel with the second side;

first redistribution wiring layers that electrically connect the first electrode pads, the first central bonding pads and the first bonding pads in a one-to-one correspondence relationship, respectively;

second redistribution wiring layers that electrically connect the second electrode pads, the second central bonding pads and the second bonding pads in a one-to-one correspondence relationship, respectively; and a chip encapsulating layer formed on the main surface with a thickness that causes top faces of the first and second central bonding pads and top faces of the first and second bonding pads to be exposed.

According to the above configuration, the bending strength is reinforced as compared with the case of only the semiconductor chip because of the semiconductor chip package equipped with the encapsulating layer.

Therefore, when the invention is applied to, for example, a multi package in which the semiconductor chip packages are laminated with being shifted stepwise, the concentration of stress on a root or basal portion of a visor upon wire bonding with respect to a portion that protrudes in a visored form can be relaxed.

Further, since the bonding force of each bump at the portion that protrudes in the visored form can be sufficiently ensured, the occurrence of cracks caused by a filler containing an encapsulating resin can be suppressed.

When the invention is applied to, for example, a multi package in which the semiconductor chip packages are laminated with being shifted stepwise, the pads lying between the semiconductor chip packages can be connected to one another by their corresponding wires. Thus, the electrical connections between the respective semiconductor chip packages and the substrate can be carried out via the pads of other semiconductor chip package.

As a result, the length of each bonding wire can be shortened and the height thereof can be lowered, as compared with the case in which the bonding wires directly connect between the respective semiconductor chips and the substrate.

Thus, a wire layout free of contact between the plural bonding wires can be realized. Hence, the occurrence of a malfunction due to a short, a break or the like caused by wire shifting or flowage can be suppressed.

It is thus possible to realize a multichip package having higher reliability as compared with the conventional one.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

FIGS. 10(A) and 10(B) are respectively schematic cross-sectional views for describing the first and second semiconductor chip packages according to the third embodiment of the present invention;

DETAILED DESCRIPTION OF THE INVENTION

Figure 1:
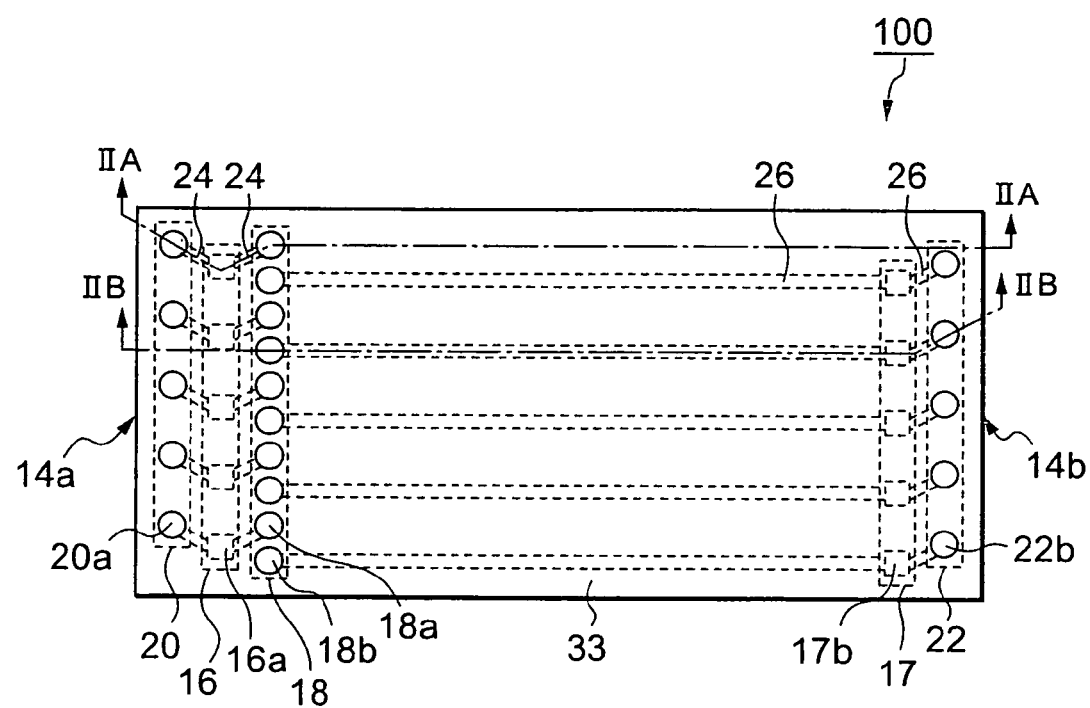
FIG. 1 is a schematic plan view for describing one example of the relationship of layout between components of a semiconductor chip package according to a first embodiment of the present invention.

Preferred embodiments of the present invention will hereinafter be described with reference to the accompanying drawings. Incidentally, the drawings merely schematically show the size, shape and positional relationships of respective components to such a degree that the present invention can be understood. Thus, the present invention is by no means limited to the illustrated examples. In order to make it easy to understand the drawings, hatchings indicative of cross-sections are omitted except for parts. Although specific materials and conditions or the like might be used in the following description, these materials and conditions are nothing but one preferred example. Accordingly, no limitations are imposed on them. Similar components illustrated in the respective drawings are respectively identified by the same reference numerals, and the description of certain common components might be omitted.

First Embodiment

A semiconductor chip package and a multichip package according to a first embodiment of the present invention will be explained with reference to FIGS. 1 through 4.

Figure 2A:
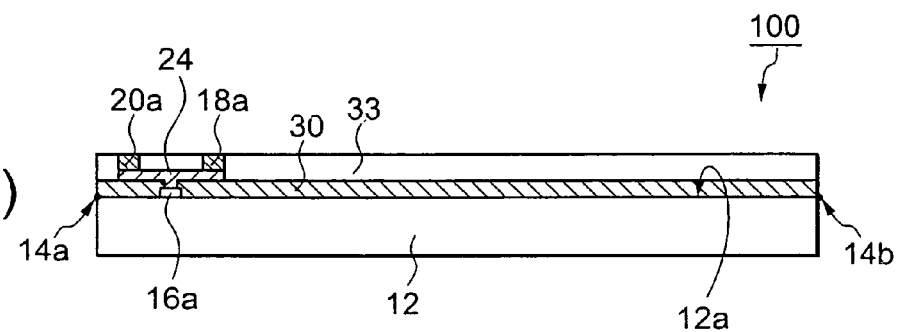
FIGS. 2(A) and 2(B) are respectively schematic cross-sectional views for describing the semiconductor chip package according to the first embodiment of the present invention.
Figure 2B:
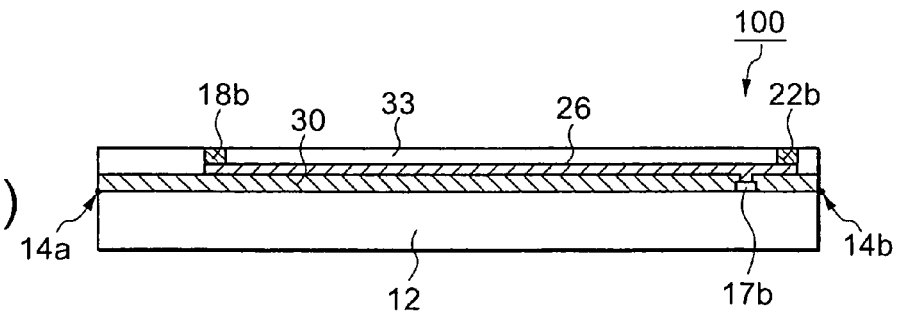
Figure 3:
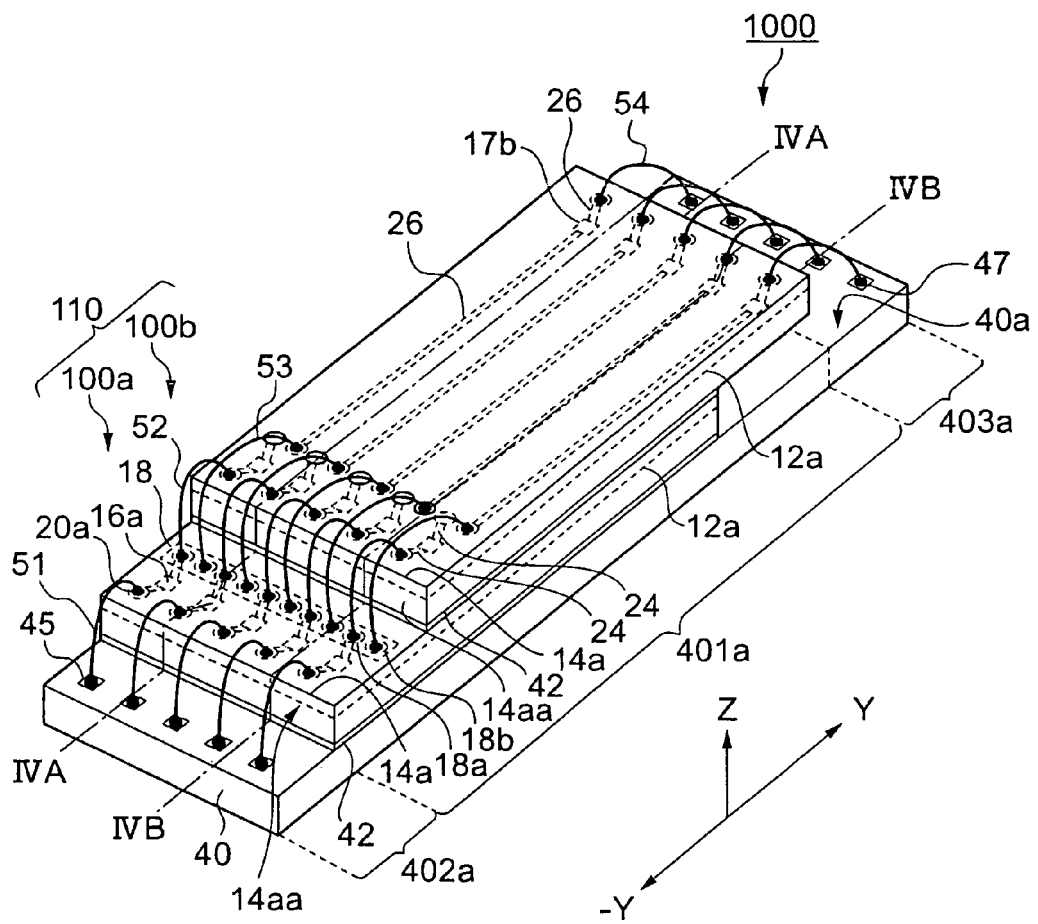
FIG. 3 is a schematic perspective view for describing a multichip package according to a first embodiment of the present invention.
Figure 4A:
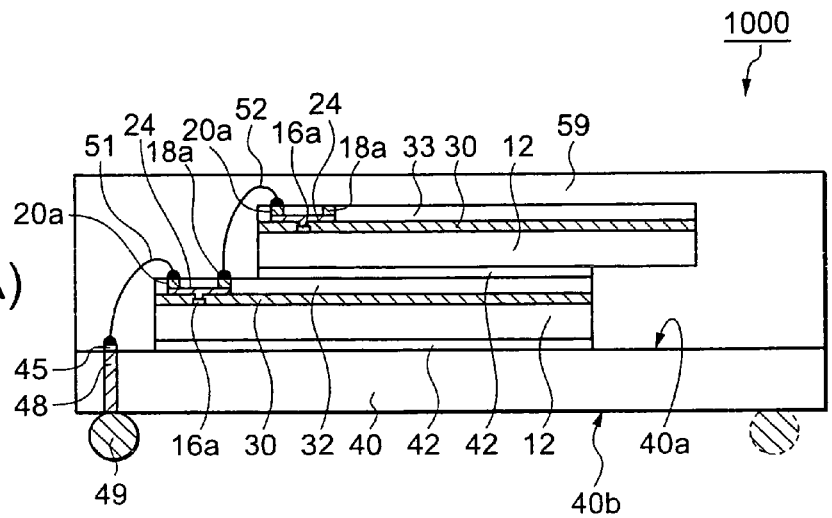
FIGS. 4(A) and 4(B) are respectively schematic cross-sectional views for describing the multichip package according to the first embodiment of the present invention.
Figure 4B:
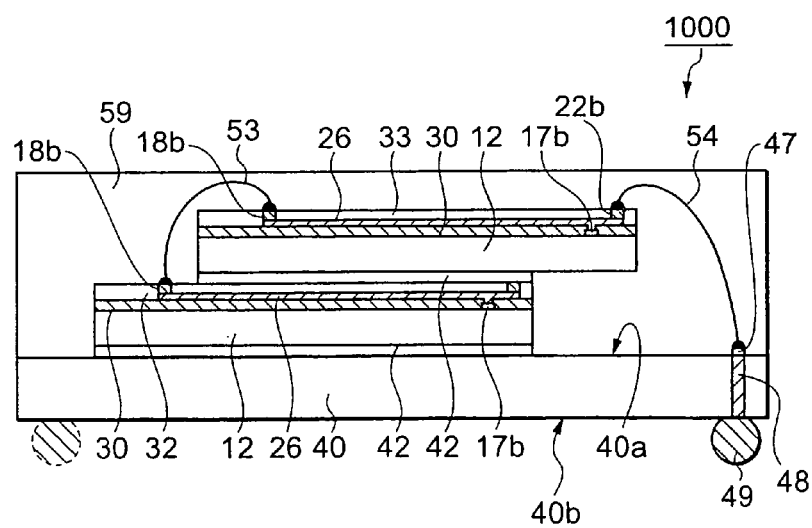

FIG. 1 is a plan view schematically showing one configurational example of a semiconductor chip package 100 according to the present embodiment. FIG. 2(A) is a schematic view showing a cut-away portion (i.e., section) obtained by cutting FIG. 1 along broken line IIA-IIA of FIG. 1. FIG. 2(B) is a schematic view showing a cut-away portion obtained by cutting FIG. 1 along broken line IIB-IIB of FIG. 1. FIG. 3 is a perspective view schematically showing one configurational example of a multichip package 1000 according to the present embodiment. FIG. 4(A) is a schematic view showing a cut-away portion obtained by cutting FIG. 3 along broken line IVA-IVA of FIG. 3. FIG. 4(B) is a schematic view showing a cut-away portion obtained by cutting FIG. 3 along broken line IVB-IVB of FIG. 3.

As shown in FIGS. 1 and 2, a semiconductor chip 12 included in the semiconductor chip package 100 has a main surface 12a shaped in a square form, or shaped in a rectangular form in the present embodiment. The main surface 12a of the semiconductor chip includes a pair of first and second sides 14a and 14b opposite to each other. In the present configurational example, the first and second sides 14a and 14b are defined as two sides opposite to each other in the longitudinal direction of the semiconductor chip.

A first electrode pad group 16 is provided in the main surface 12a of the semiconductor chip 12 along the first side 14a, whereas a second electrode pad group 17 is provided therein along the second side 14b.

A plurality of first electrode pads 16a are disposed in the first electrode pad group 16 along the first side 14a every predetermined intervals. A plurality of second electrode pads 17b are disposed in the second electrode pad group 17 along the second side 14b every predetermined intervals. In the present configurational example, these first and second electrode pads 16a and 17b are respectively arranged in alignment at the same intervals. The first and second electrode pads (16a and 17b) are respectively electrically connected to circuit elements (not shown) built in the semiconductor chip 12. Also these first and second electrode pads (16a and 17b) are respectively formed of a conductive material such as aluminum (Al). Incidentally, even though the first and second electrode pads (16a and 17b) are illustrated five by five in the drawing for convenience, the number thereof is not limited to it. The shapes of the first and second electrode pads (16a and 17b) and their layout intervals can also be changed arbitrarily and suitably according to the purpose and design of the semiconductor chip package.

Further, in the present configurational example, a central bonding pad group (hereinafter might be called simply "central pad group") 18 is provided on the main surface 12a of the semiconductor chip 12. The central pad group 18 is located in a position interposed between the first and second electrode pad groups (16 and 17). The central pad group 18 is made up of first central bonding pads (hereinafter might be called simply "first central pads") 18a corresponding to the first electrode pads 16a, and second central bonding pads (hereinafter might be called simply "second central pads") 18b corresponding to the second electrode pads 17b so as to approach the first electrode pad group 16, i.e., extend along the first electrode pad group 16 in the neighborhood of the first electrode pads 16a. In the present configurational example, the first and second central pads (18a and 18b) are disposed in alignment alternately and every predetermined intervals, e.g., at the same intervals.

A first bonding pad group (hereinafter might be called simply "first pad group") 20 is provided between the first side 14a and the first electrode pad group 16 along the first side 14a. A plurality of first bonding pads (hereinafter might be called simply "first pads") 20a provided corresponding to the first electrode pads 16a are disposed in the first pad group 20 in alignment every predetermined intervals, e.g., at the same intervals.

A second bonding pad group (hereinafter might be called simply "second pad group") 22 are provided between the second side 14b and the second electrode pad group 17 along the second side 14b. A plurality of second bonding pads (hereinafter might be called simply "second pads") 22b provided corresponding to the second electrode pads 17b are disposed in the second pad group 22 in alignment along the second side 14b every predetermined intervals, e.g., at the same intervals. Incidentally, the shapes and layout intervals of the first and second central pads (18a and 18b) and the first and second pads (20a and 22b) can be changed arbitrarily and suitably according to specs or the like of the semiconductor chip package. The first and second electrode pads (16a and 17b) are respectively formed of aluminum (Al). The first and second central pads (18a and 18b) and the first and second bonding pads (20a and 20b) may respectively be configured as a structure in which junction portions made of silver (Ag) are respectively provided on top faces of copper (Cu) shaped in columnar form, or a structure in which junction portions made of gold (Au) with nickel (Ni) or titanium (Ti) as a barrier metal are provided on top faces of copper (Cu) shaped in columnar form.

Thus, in the present configurational example, the first pad group 20, the first electrode pad group 16, the central pad group 18, the second electrode pad group 17 and the second pad group 22 are respectively arranged in parallel between the first side 14a and the second side 14b in order from the first side 14a.

The first central pads 18a and the first pads 20a are electrically connected to their corresponding first electrode pads 16a by means of first redistribution wiring layers 24 in a one-to-one correspondence relationship with one another.

The second central pads 18b and the second pads 22b are respectively electrically connected to their corresponding second electrode pads 17b by means of second redistribution wiring layers 26 in a one-to-one correspondence relationship with one another. The first and second redistribution wiring layers (24 and 26) are respectively formed of a conductive material such as copper.

As shown in FIG. 2(A), the first electrode pads 16a electrically connected to internal circuit elements (not shown) are formed on the main surface 12a of the semiconductor chip 12. An insulating film 30 is formed on the main surface 12a of the semiconductor chip so as to expose the top faces of the first electrode pads 16a. The insulating film 30 is, for example, a film obtained by sequentially forming a passivation film made up of a silicon nitride film and a protective film made up of a polyimide film. The first electrode pads 16a are respectively electrically connected to the first central pads 18a and the first pads 20 assigned to connecting destinations via the first redistribution wiring layers 24 extending from over the first electrode pads 16a to over the insulating film 30. The first central pads 18a are provided in an area between the first and second electrode pad groups (16 and 17) of the main surface 12a of the semiconductor chip. In particular, the first central pads 18a are provided in an area near the first electrode pad group 16 at positions opposite to the first electrode pad group 16 in close vicinity of the first electrode pad group 16. The first pads 20a are provided in an area between the first electrode pad group 16 and the first side 14a of the main surface 12a of the semiconductor chip. In particular, the first pads 20a approach the first side 14a and are provided at positions opposite to the first side 14a.

As shown in FIG. 2(B), the second electrode pads 17b electrically connected to internal circuit elements (not shown) are formed on the main surface 12a of the semiconductor chip 12. An insulating film 30 is formed on the main surface 12a of the semiconductor chip so as to expose the top faces of the second electrode pads 17b in a manner similar to FIG. 2(A). The second electrode pads 17b are respectively electrically connected to the second central pads 18b and the second pads 22b assigned to connecting destinations via the second redistribution wiring layers 26 extending from over the second electrode pads 17b to over the insulating film 30. The second central pads 18b are provided in an area between the first and second electrode pad groups (16 and 17) of the main surface 12a of the semiconductor chip. In particular, the second central pads 18b are provided in an area near the first electrode pad group 16 at positions opposite to the first electrode pad group 16 in close vicinity of the first electrode pad group 16. The second pads 22b are provided in an area between the second electrode pad group 17 and the second side 14b of the main surface 12a of the semiconductor chip. In particular, the second pads 22b approach the second side 14b and are provided at positions opposite to the second side 14b.

Thus, according to the layout structures of the respective pads referred to above, the first central pads 18a and the first pads 20a can be respectively relocated at shifted predetermined positions on the side above the semiconductor chip 12 by the first redistribution wiring layers 24 without depending on the positions of the first electrode pads 16a. Similarly, the second central pads 18b and the second pads 22b can be respectively relocated at shifted predetermined positions on the side above the semiconductor chip 12 by the second redistribution wiring layer 26 without depending on the positions of the second electrode pads 17b.

As shown in FIGS. 2(A) and 2(B), a sealing or encapsulating layer 33 made up of an epoxy resin or the like is formed on the upper side of the main surface 12a of the semiconductor chip 12. The encapsulating layer 33 is provided so as to embed the insulating film 30, the first redistribution wiring layers 24 and the second redistribution wiring layers 26 or the like therein and expose the top faces of the first and second central pads (18a and 18b) and the first and second pads (20a and 22b) respectively. Incidentally, the first and second electrode pads (16a and 17b) are formed of Al. The first and second central pads (18a and 18b) and the first and second bonding pads (20a and 22b) may respectively be configured as a structure in which junction portions made of Ag are respectively provided on top faces of Cu shaped in columnar form or a structure in which junction portions made of Au with Ni or Ti as a barrier metal are respectively provided on top faces of Cu shaped in columnar form.

Subsequently, a multichip package 1000 in which the semiconductor package having the above configuration is laminated in plural form, will be explained with reference to FIG. 3 and FIGS. 4(A) and 4(B).

The multichip package 1000 according to the present embodiment is configured by mounting, on a rectangular mounting surface 40a of a substrate 40 shaped in the form of rectangular parallelepiped, a laminated body 110 in which first and second semiconductor chip packages (100a and 100b) each having the above configuration are laminated in their thickness direction (Z direction in the drawing). Incidentally, although the laminated body employed in the present configurational example has the configuration in which the first and second semiconductor chip packages are laminated, the laminated body is not limited to it. The laminated body may take a configuration in which three or more semiconductor chip packages are laminated. Further, ones other than the uppermost stage, i.e., the semiconductor chip package farthest away from the substrate may be configured as semiconductor chips according to specs or the like. Owing to the laminated configuration of semiconductor chips, the thinning of the whole multichip package can be put forward. The form of the laminated body is not limited to only the stepwise one. The laminated body may be set to various forms according to purposes and design or the like.

The mounting surface 40a of the substrate includes an opposite area 401a opposed to the laminated body 110, and a pair of first and second non-opposite areas (402a and 403a) adjacent to each other with the opposite area 401a interposed therebetween. The first and second non-opposite areas (402a and 403a) employed herein are areas in which the mounting surface 40a of the substrate and the chip laminated body 110 do not overlap when the multichip package 1000 is seen from above on a plane basis. In the present embodiment, the non-opposite areas (402a and 403a) are placed in positions where they interpose the opposite area 401a therebetween as viewed in the direction normal to the first and second sides (14a and 14b).

The chip laminated body 110 is provided in the opposite area 401a in such a manner that main surfaces 12a of semiconductor chips of the first and second semiconductor chip packages (100a and 100b) are faced in the directions (Z direction in the figure) identical to each other, and side faces 14aa including the first sides 14a thereof are faced in the directions (−Y direction in the figure) identical to each other. Further, the second semiconductor chip 100b is laminated on the surface of the first semiconductor chip package 100a with being shifted in the direction (Y direction in the figure) faced from the first side 14a to the second side 14b so that a central pad group 18 of the first semiconductor chip package 100a is exposed.

Incidentally, adhesive layers 42 each made up of a dice bond agent adhere and fix between the mounting surface 40a and the first semiconductor chip package 100a and between the first semiconductor chip package 100a and the second semiconductor chip package 100b.

Third bonding pads (hereinafter might be called simply "third pads") 45 respectively corresponding to first pads 20a are disposed in the first non-opposite area 402a in alignment along the first side 14a every predetermined intervals, e.g., at the same intervals. Fourth pads 47 respectively corresponding to second pads 22b are disposed in the second non-opposite area 403a in alignment along the second side 14b every predetermined intervals, e.g., at the same intervals. Incidentally, the third and fourth pads (45 and 47) are electrically connected to their corresponding external terminals 49 such as solder balls via conductive contacts 48 that penetrate between the mounting surface 40a of the substrate 40 and a back surface 40b opposite to the mounting surface 40a, for example (see FIG. 4).

In the present configurational example, the third bonding pads 45 in the non-opposite area 402a of the substrate, and the first pads 20a of the first semiconductor chip package 100a are individually connected by first bonding wires 51 in a one-to-one correspondence relationship.

First central pads 18a of the first semiconductor chip package 100a and the first pads 20a of the second semiconductor chip package 100b are individually connected by second bonding wires 52 in a one-to-one correspondence relationship.

Second central pads 18b of the first semiconductor chip package 100a and second central pads 18b of the second semiconductor chip package 100b are individually connected by third bonding wires 53 in a one-to-one correspondence relationship.

The second pads 22b of the second semiconductor chip package 100b and the fourth bonding pads 47 in the second non-opposite area 403a of the substrate 40 are individually connected by fourth bonding wires 54 in a one-to-one correspondence relationship.

Incidentally, the relationship of connection by the bonding wires is not limited to only the above combinations. Thus, although, for instance, the first central pads 18a of the first semiconductor chip package 100a can be connected to their corresponding first central pads 18a of the second semiconductor chip package 100b, the pads placed in the positions where wire lengths can be shortened, may preferably be connected to one another. Further, the order of connecting the bonding wires is not limited either. That is, no limitation is imposed on, for example, the connection from the first central pads 18a of the first semiconductor chip package 100a to the first central pads 18a of the second semiconductor chip package 100b or the connection from the first central pads 18a of the second semiconductor chip package 100b to the first central pads 18a of the first semiconductor chip package 100a. The respective bonding wires and bumps employed in the present embodiment are respectively formed of gold (Au).

In the multichip package according to the present configurational example, as shown in FIGS. 4(A) and 4(B), the first and second semiconductor chip packages (100a and 100b) mounted over the mounting surface 40a of the substrate, and the first, second, third and fourth bonding wires (51, 52, 53 and 54) mounted thereon are principally sealed with an encapsulating portion 59 formed of a mold resin or the like. Incidentally, although the above configurational example has explained the multichip package in which the two semiconductor chip packages are laminated, the present invention is not limited to it. Thus, the present invention can be applied to a multichip package in which semiconductor chip packages of three or more are laminated according to purposes and specs or the like.

As is apparent from the above description, the multichip package according to the present embodiment has a configuration wherein a plurality of semiconductor chip packages are laminated stepwise.

Since the redistribution wiring layers that constitute the semiconductor chip package may be formed in an assembly process subsequent to the completion of a wafer process, there is no need to change the layout of electrode pads and wirings or wires in the wafer process.

Thus, the multichip package according to the present embodiment can be realized using the existing semiconductor chips.

In the multichip package according to the present embodiment as well, the pads lying between the semiconductor chip packages can also be connected by their corresponding wires. Thus, the electrical connections between the respective semiconductor chip packages and the substrate can be implemented via the pads of other semiconductor chip package.

As a result, the length of each bonding wire can be shortened and the height thereof can be lowered, as compared with the case in which the bonding wires directly connect between the respective semiconductor chips and the substrate as in the prior art.

Thus, since a wire layout free of contact between the bonding wires can be realized, the occurrence of a malfunction due to a short, a break or the like caused by wire shifting can be suppressed.

Further, since there is provided the semiconductor chip packages equipped with the encapsulating layer or the like, a bending strength is reinforced as compared with the case of only the semiconductor chips.

As a result, when the invention is applied to a multi package in which the semiconductor chip packages are laminated stepwise, there is no fear that a root or basal portion of a visor will break due to stress upon wire bonding with respect to a portion that protrudes in a visored manner.

Further, since the bonding force of each bump at the portion that protrudes in the visored form can be sufficiently ensured, the occurrence of cracks caused by a filler containing an encapsulating resin can be suppressed.

It is thus possible to realize a multichip package having higher reliability as compared with the conventional one.

Second Embodiment

A semiconductor chip package and a multichip package according to a second embodiment of the present invention will be explained with reference to FIGS. 5 through 8.

Figure 5A:
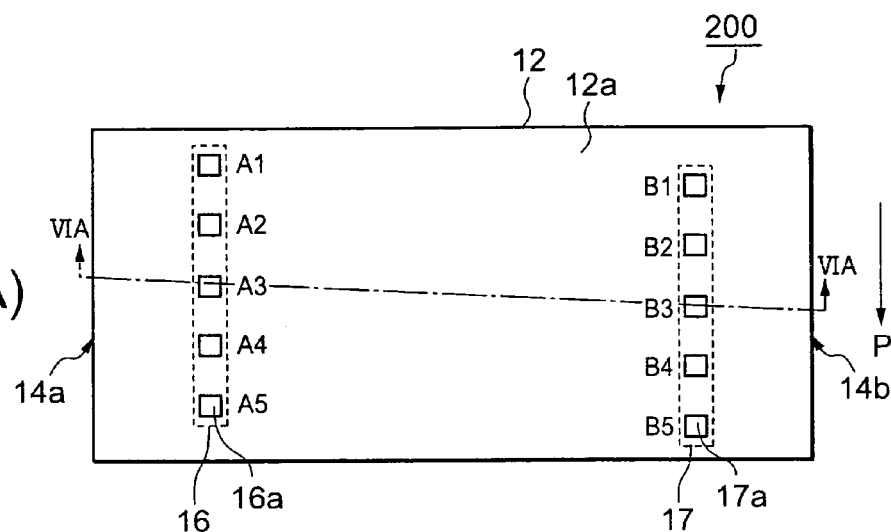
FIGS. 5(A) and 5(B) are respectively schematic plan views for describing one example illustrative of the relationship of layout among components of a semiconductor chip structural body and a semiconductor chip package according to a second embodiment of the present invention.
Figure 5B:
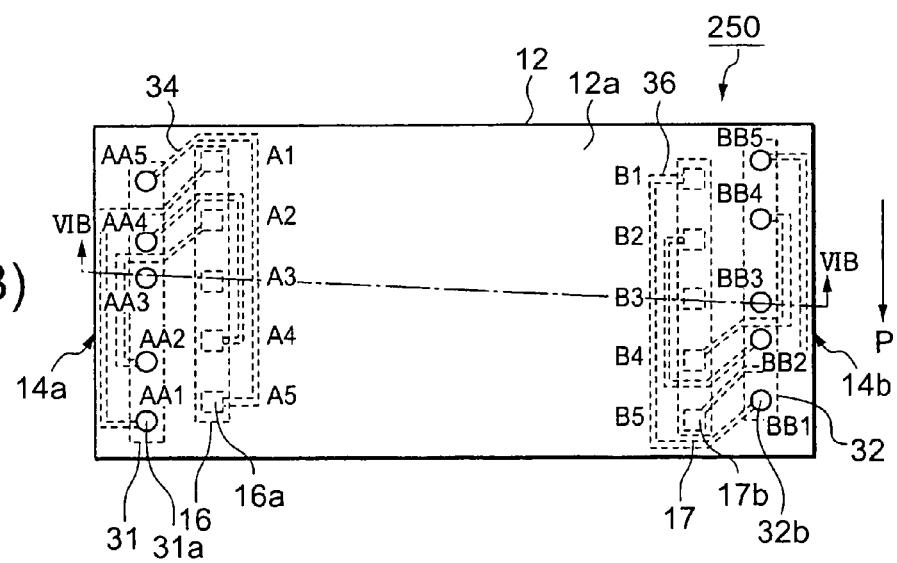
Figure 6A:
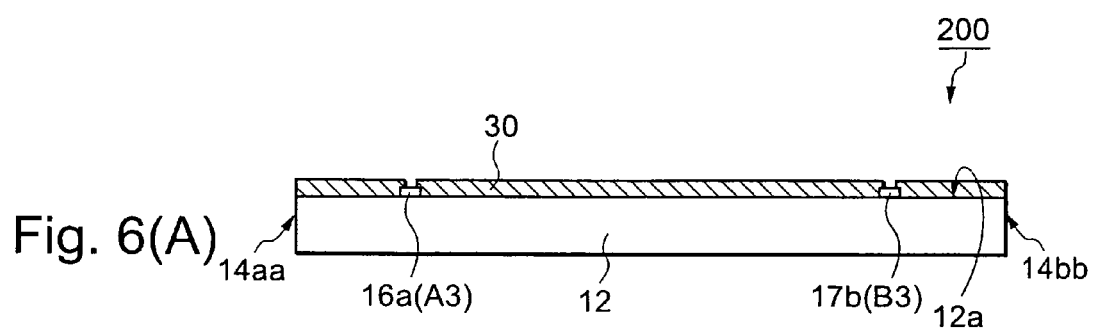
FIG. 6(A) and 6(B) are respectively schematic cross-sectional views for describing the semiconductor chip structural body and the semiconductor chip package according to the second embodiment of the present invention.
Figure 6B:
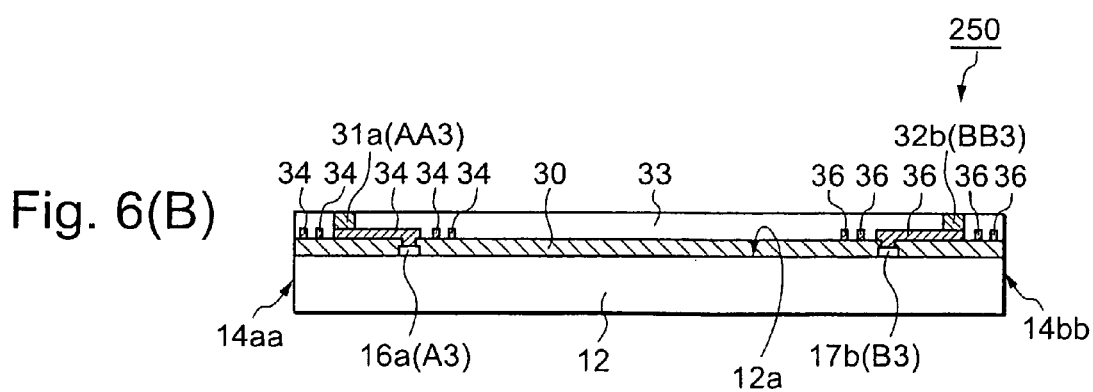
Figure 7A:
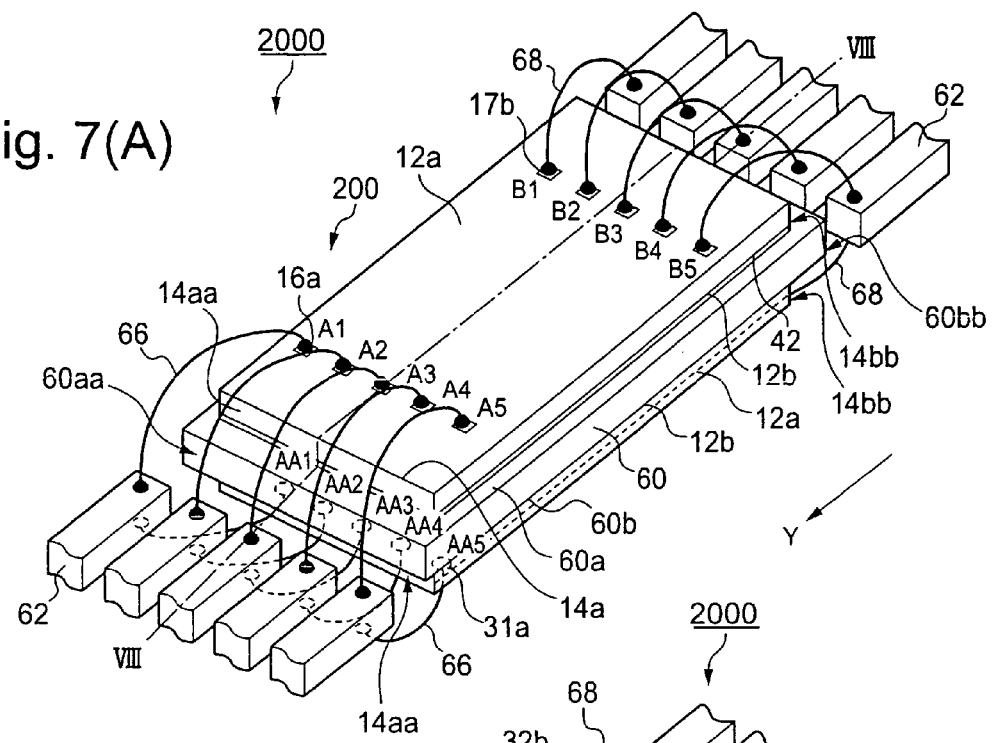
FIGS. 7(A) and 7(B) are respectively schematic perspective views for describing a multichip package according to a second embodiment of the present invention.
Figure 7B:
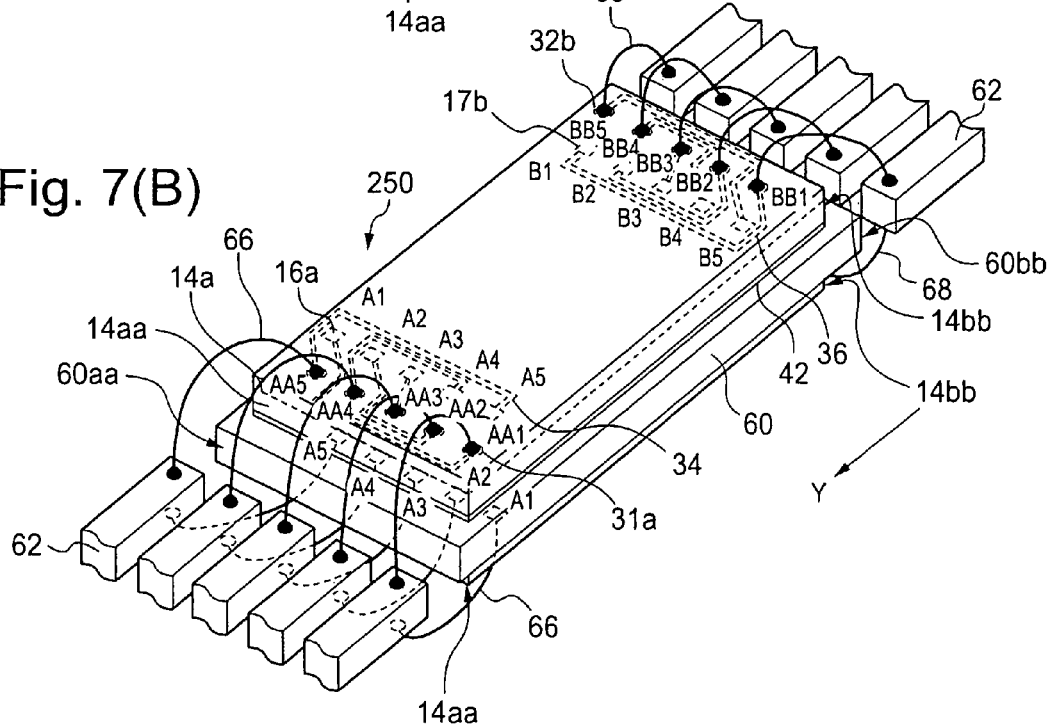
Figure 8:
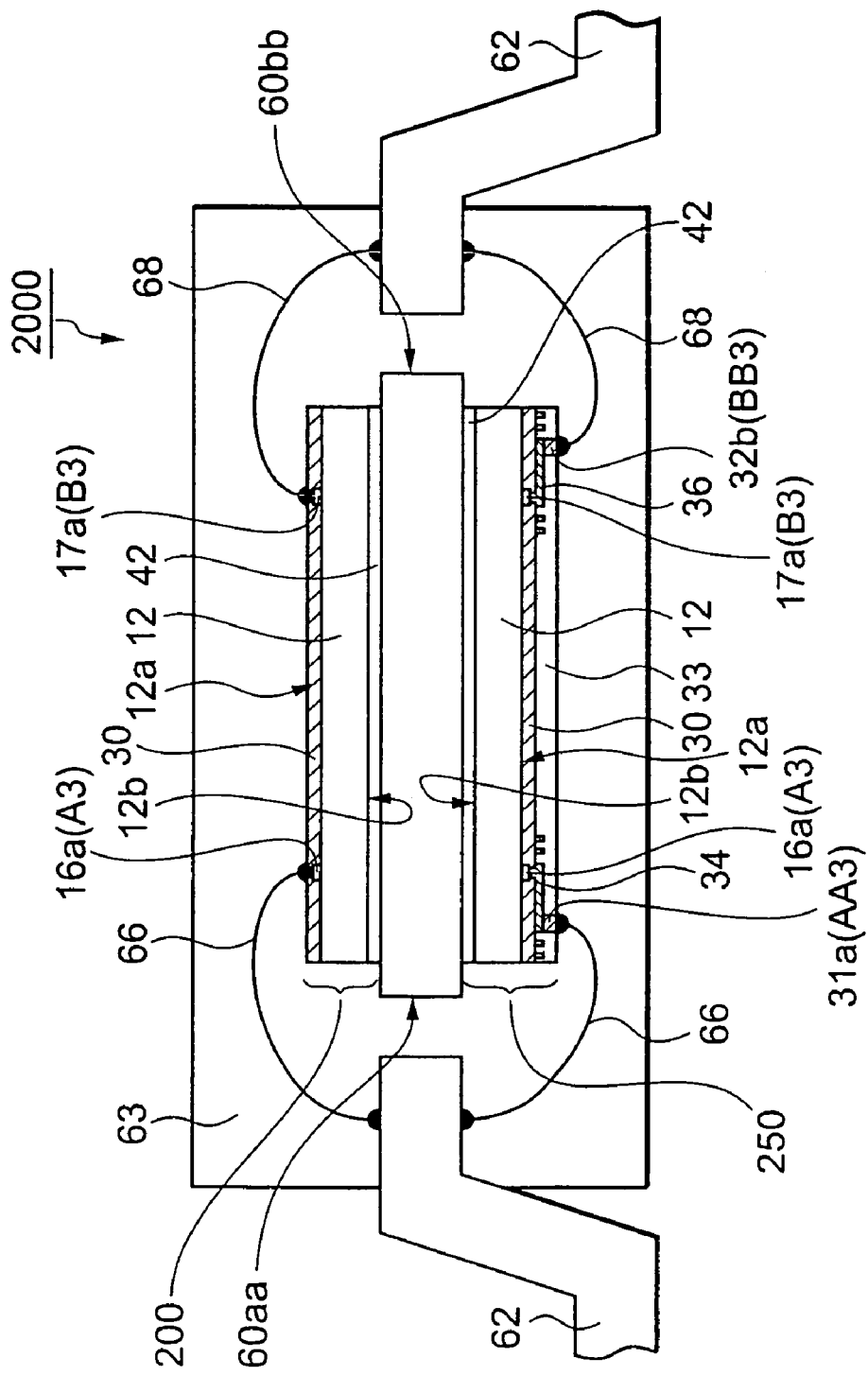
FIG. 8 is a schematic cross-sectional view for describing the multichip package according to the second embodiment of the present invention.

FIGS. 5(A) and 5(B) are respectively plan views schematically showing one configurational examples of a semiconductor chip structural body 200 and a semiconductor chip package 250 according to the present embodiment. FIG. 6(A) is a schematic cross-sectional view showing a cut-away portion obtained by cutting FIG. 5(A) along broken line VIA-VIA of FIG. 5(A). FIG. 6(B) is a schematic cross-sectional view showing a cut-away portion obtained by cutting FIG. 5(B) along broken line VIB-VIB of FIG. 5(B). FIG. 7(A) is a perspective view schematically showing one configurational example of a multichip package 2000 according to the present embodiment. FIG. 7(B) is a perspective view of the multichip package 2000 as viewed from its back side. FIG. 8 is a schematic cross-sectional view showing a cut-away portion obtained by cutting FIG. 7(A) along broken line VIII-VIII of FIG. 7(A).

The present embodiment is principally different from the first embodiment in that, of a pair of semiconductor chip structural bodies identical in structure and function, constituting the multichip package 2000, one semiconductor chip structural body has a package structure and the back surfaces of both semiconductor chips are laminated face to face with each other. The same components as those already described in the first embodiment are respectively identified by the same reference numerals, and their specific description might be omitted.

In the semiconductor chip structural body 200, as shown in FIG. 5(A), a first electrode pad group 16 in which a plurality of first electrode pads 16a are disposed in alignment along a first side 14a every predetermined intervals, e.g., at the same intervals, is formed on a main surface 12a of a semiconductor chip 12 in a manner similar to the first embodiment. A second electrode pad group 17 in which a plurality of second electrode pads 17b are disposed in alignment along a second side 14b every predetermined intervals, e.g., at the same intervals, is formed on the main surface 12a of the semiconductor chip.

In the present embodiment, the respective first electrode pads 16a included in the first electrode pad group 16 are shown with being assigned numbers of A1 to An (where n: integer greater than or equal to 2)(n=5 for convenience in the present embodiment: A1, A2, A3, A4 and A5) in order in a first direction (P direction in the figure). Further, the respective second electrode pads 17b included in the second electrode pad group 17 are illustrated with being assigned numbers of B1 to Bn (where n: integer greater than or equal to 2)(n=5 for convenience in the present embodiment: B1, B2, B3, B4 and B5) in order in a second direction (P direction similarly in the figure).

On the other hand, in the semiconductor chip package 250, as shown in FIG. 5(B), a first electrode pad group 16 is provided on a main surface 12a of a semiconductor chip 12 along a first side 14a in a manner similar to FIG. 5(A), and a second electrode pad group 17 is provided thereon along a second side 14b. In a manner similar to FIG. 5(A), the first electrode pads 16a are respectively shown with being assigned numbers of A1 to A5. Also the second electrode pads 17b are respectively shown with being assigned numbers of B1 to B5.

Further, a first bonding pad group (hereinafter might be called simply "first pad group") 31 is provided between the first side 14a and the first electrode pad group 16 along the first side 14a. A plurality of first bonding pads (hereinafter might be called simply "first pads") 31a respectively provided corresponding to the first electrode pads 16a are disposed in the first pad group 31 every predetermined intervals.

In the present embodiment, the n (where n: integer greater than or equal to 2)th to 1st first pads 31a are provided in reverse order in an area between the first side 14a and the first electrode pad group 16 so as to be parallel to the first side 14a and correspond to the respective first electrode pads 16a. That is, the respective first pads 31a are shown with begin assigned numbers of AA1 to AAn (where n: integer greater than or equal to 2)(n=5 for convenience in the present embodiment: AA1, AA2, AA3, AA4 and AA5) in order from direction opposite to the first direction (P direction in the figure).

A second bonding pad group (hereafter might be called simply "second pad group") 32 is provided between the second side 14b and the second electrode pad group 17 along the second side 14b. A plurality of second bonding pads (hereinafter might be called "second pads") 32b provided corresponding to the respective second electrode pads 17b are disposed in the second pad group 32 along the second side 14b every predetermined intervals.

In the present embodiment, the n (where n: integer greater than or equal to 2)th to 1st second pads 32b are provided in reverse order in an area between the second side 14b and the second electrode pad group 17 so as to be parallel to the second side 14b and correspond to the respective second electrode pads 17b. That is, the respective second pads 32b are shown with begin assigned numbers of BB1 to BBn (where n: integer greater than or equal to 2)(n=5 for convenience in the present embodiment: BB1, BB2, BB3, BB4 and BB5) from direction opposite to the second direction (P direction similarly in the figure).

Then, the Ai (where i: integers from 1 to n)th first electrode pads 16a and the AAi (where i: integers from 1 to n)th first pads 31a are respectively electrically connected by first redistribution wiring layers 34 in a one-to-one correspondence relationship. Further, the Bi (where i: integers from 1 to n)th second electrode pads 17b and the BBi (where i: integers from 1 to n)th second pads 32b are respectively electrically connected by second redistribution wiring layers 36 in a one-to-one correspondence relationship.

As shown in FIGS. 6(A) and 6(B), the Ai (where i: integers from 1 to n)th first electrode pads 16a and the Bi (wherein i: integers from 1 to n)th second electrode pads 17b respectively electrically connected to internal circuit elements (not shown) are formed in the main surface 12a of the semiconductor chip 12.

As shown in FIG. 6(B) as well, the Ai (where i: integers from 1 to n)th first electrode pads 16a are electrically connected to their corresponding AAi (where i: integers from 1 to n)th first pads 31a assigned as connecting destinations by the first redistribution wiring layers 34 extending from over the first electrode pads 16a to over an insulating film 30. The first pads 31a are provided in the area between the first electrode pad group 16 and the first side 14a, of the main surface 12a of the semiconductor chip. In particular, the first pads 31a are respectively provided at positions opposite to the first side 14a in close vicinity to the first side 14a.

The Bi (where i: integers from 1 to n)th second electrode pads 17b are electrically connected to their corresponding BBi (where i: integers from 1 to n)th second pads 32b assigned as connecting destinations by the corresponding second redistribution wiring layers 36 extending from over the second electrode pads 17b to over the insulating film 30. The second pads 32b are provided in the area between the second electrode pad group 17 and the second side 14b, of the main surface 12a of the semiconductor chip. In particular, the second pads 32b are respectively provided at positions opposite to the second side 14b in close vicinity to the second side 14b.

An encapsulating layer 33 made up of an epoxy resin or the like is formed on the upper side of the main surface 12a of the semiconductor chip 12 of the semiconductor chip package 250. The encapsulating layer 33 is provided so as to embed the insulating film 30, the first redistribution wiring layers 34 and the second redistribution wiring layers 36 or the like therein and expose the top faces of the first and second pads (31a and 32b) respectively.

Subsequently, the multichip package 2000 provided with a laminated body of the semiconductor chip structural body 200 and semiconductor chip package 250 each having the above configuration will be explained with reference to FIG. 7(A) and FIG. 8.

In the multichip package 2000 according to the present embodiment, the semiconductor chip structural body 200 is mounted on a rectangular main surface 60a of a die pad 60 shaped in the form of rectangular parallelepiped. On the other hand, the semiconductor chip package 250 is mounted on a back surface 60b opposite to the main surface 60a of the die pad 60. Both end faces or both side faces of the structural body 200 and package 250, which are normal to their longitudinal directions, are respectively configured as 14aa and 14bb. Both end faces or both side faces normal to the longitudinal direction of the die pad 60 are respectively configured as 60aa and 60bb.

At this time, the semiconductor chip structural body 200 and the semiconductor chip package 350 are provided in such a manner that back surfaces 12b of semiconductor chips 12 included in both are placed face to face with each other with the corresponding die pads 60 interposed therebetween, and the side faces 14aa containing the first sides 14a are respectively placed in the same direction (Y direction in the figure) (see FIG. 8). Incidentally, an adhesive layer 42 made of a dice bond agent adheres and fixes between the die pad 60 and the semiconductor chip structural body 200 and between the die pad 60 and the semiconductor chip package 250.

There are provided lead portions 62 used as a plurality of conductive portions, which are placed at positions where the die pads 60 are interposed from both side faces (60aa and 60bb) thereof and which extend with their side faces being opposite to one another. That is, when the pair of semiconductor chip structures are seen from above on a plane basis, the lead portions 62 used as the plural conductive portions extending in the directions normal to the first and second sides (14a and 14b) are provided at their corresponding positions opposite to the side faces (14aa and 14bb) on the sides of the first and second sides (14a and 14b) of the pair of semiconductor chip structures. Incidentally, the portions of the lead portions 62, which are exposed from an encapsulating portion 63 made of a mold resin or the like, are formed or molded with being bent in gull-wing lead form corresponding to one of surface-mounted lead shapes, for example (see FIG. 8).

Then, the Ai (where i: integers from 1 to n)th first electrode pads 16a of the semiconductor chip structural body 200, and the AAi (where i: integers from 1 to n)th first pads 31a of the semiconductor chip package 250 are connected to their corresponding same lead portions 62 by first bonding wires 66.

The Bi (where i: integers from 1 to n)th second electrode pads 17b of the semiconductor chip structural body 200, and the BBi (where i: integers from 1 to n)th second pads 32b of the semiconductor chip package 250 are connected to their corresponding same lead portions 62 by second bonding wires 68.

In the multichip package 2000, as shown in FIG. 8, the semiconductor chip structural body 200, the semiconductor chip package 250 and the first and second bonding wires (66 and 68) respectively mounted over the obverse and reverse sides (60a and 60b) of the die pads 60, and some of the lead portions 62 are principally sealed with a sealing or encapsulating portion 63 made of a mold resin.

As is apparent from the above description, in the multichip package according to the present embodiment, one semiconductor chip structural body of the pair of semiconductor chip structural bodies identical in structure and function, which are stacked on each other with the die pads interposed therebetween, has a package structure.

When a pair of semiconductor chip structural bodies each having the same structure and the same function are stacked on each other such that the back surfaces of semiconductor chips of the semiconductor chip structural bodies are placed face to face with each other, the sequences of arrangements of electrode pads normally result in states in which they are placed in states opposite in direction to one another.

However, according to the present embodiment, the electrode pads included in one semiconductor chip structural body are relocated by their corresponding redistribution wiring layers so as to take the same orientation as the reversed sequence of the array sequence of the electrode pads, i.e., the sequence of an arrangement of electrode pads of the facing other semiconductor chip structure, thereby making it possible to cause each semiconductor chip to function as a mirror chip.

As a result, the electrode pads and bonding pads placed in opposing positions between the pair of semiconductor chips can be easily connected to their corresponding same lead portions by the wires. Thus, it is possible to connect the same electrode pads to one another between the pair of semiconductor chips.

That is, since such a structure that signals sent from the same electrode pads can be batch-processed through the same leads, is provided, efficient signal processing is enabled.

Thus, since the multichip package can be realized using the pair of semiconductor chips each having the existing same function and structure, the fabrication of a new mirror chip becomes unnecessary.

Further, since the redistribution wiring layers that constitute each semiconductor chip package may be formed in an assembly process subsequent to the completion of a wafer process, there is no need to change the layout of electrode pads and wires in the wafer process.

Moreover, since each semiconductor chip package equipped with the encapsulating layer or the like is provided, it results in a structure in which a chip surface is reinforced as compared with the case of only the semiconductor chip. Thus, it is possible to suppress deterioration in reliability due to damage of each chip surface at chip mounting by, for example, small pieces of silicon or the like produced upon chip cutting.

Thus, a multichip package having reliability higher than ever can be realized.

Third Embodiment

A semiconductor chip package and a multichip package according to a third embodiment of the present invention will be explained with reference to FIGS. 9(A) and 9(B) through FIG. 12.

Figure 9A:
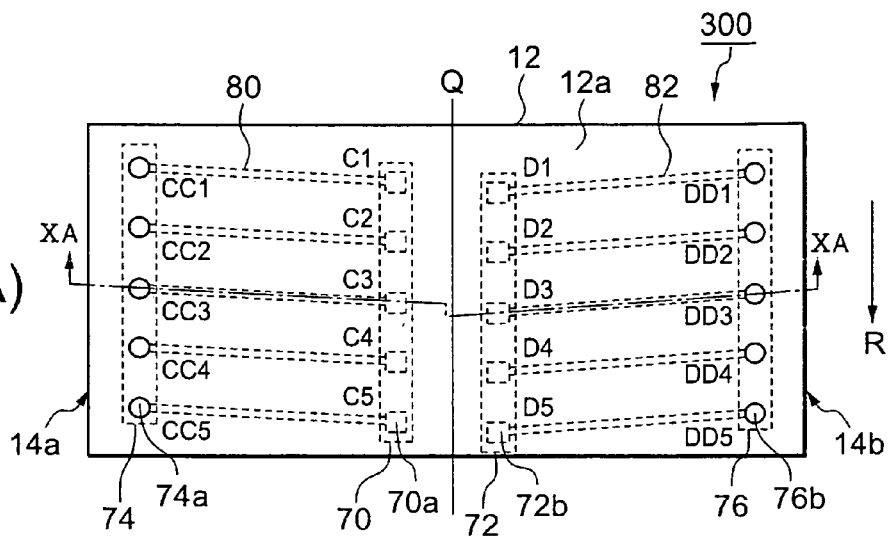
FIGS. 9(A) and 9(B) are respectively schematic plan views for describing one example illustrative of the relationship of layout among components of first and second semiconductor chip packages according to a third embodiment of the present invention.
Figure 9B:
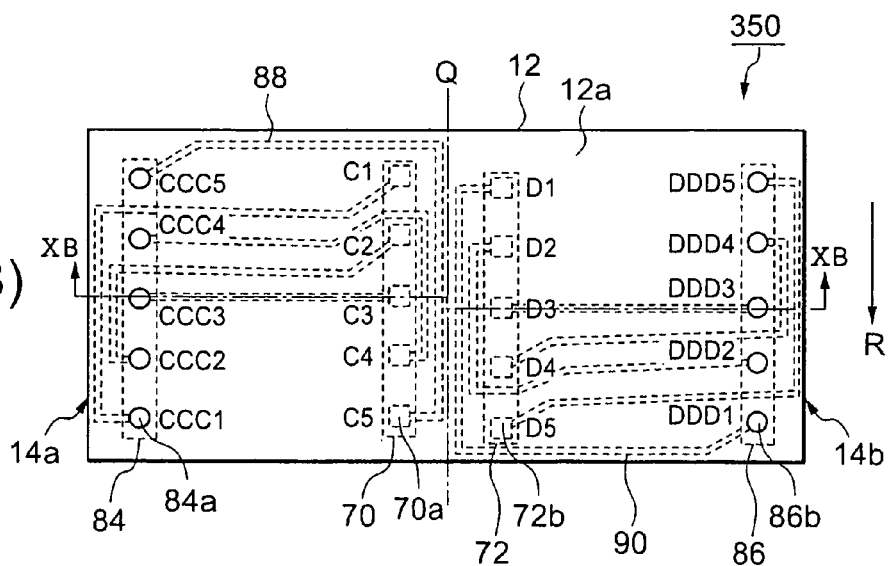
Figure 11A:
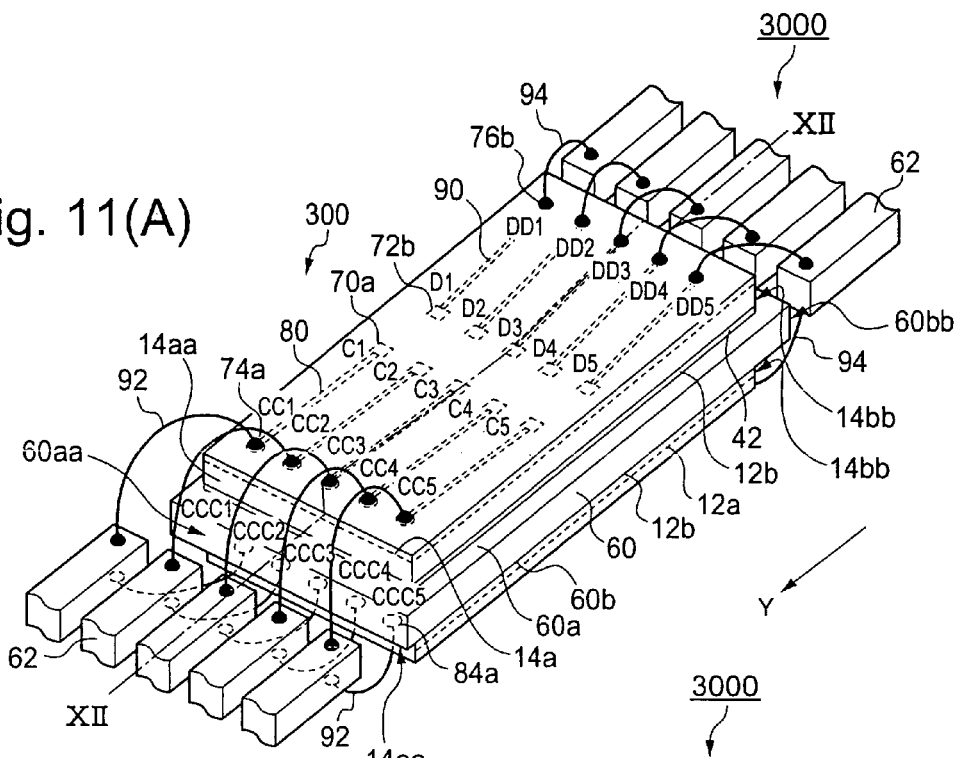
FIGS. 11(A) and 11(B) are respectively schematic perspective views for describing a multichip package according to a third embodiment of the present invention.
Figure 11B:
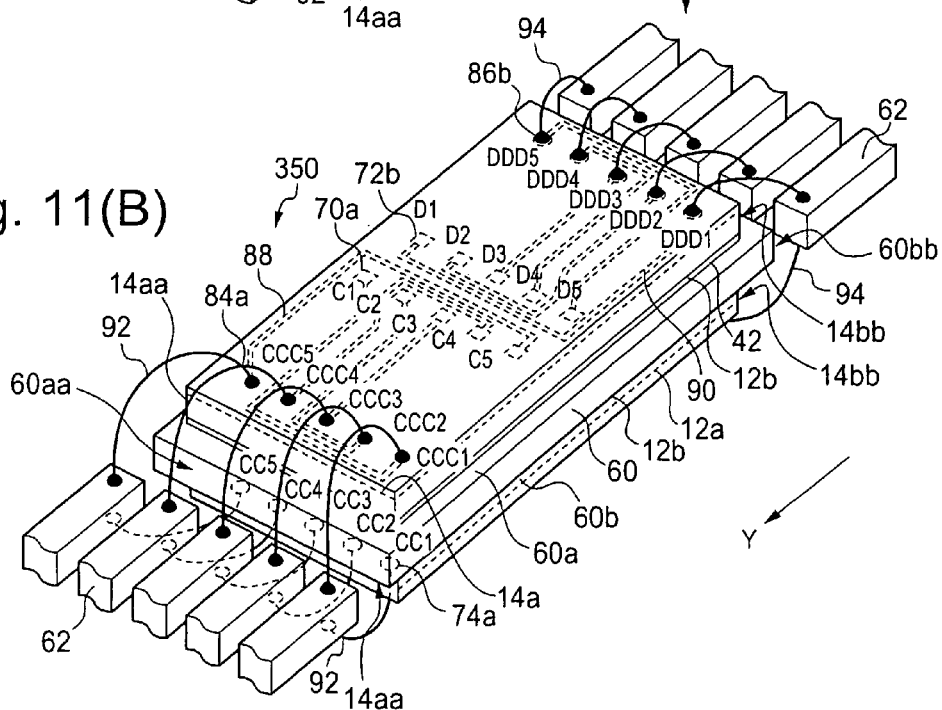
Figure 12:
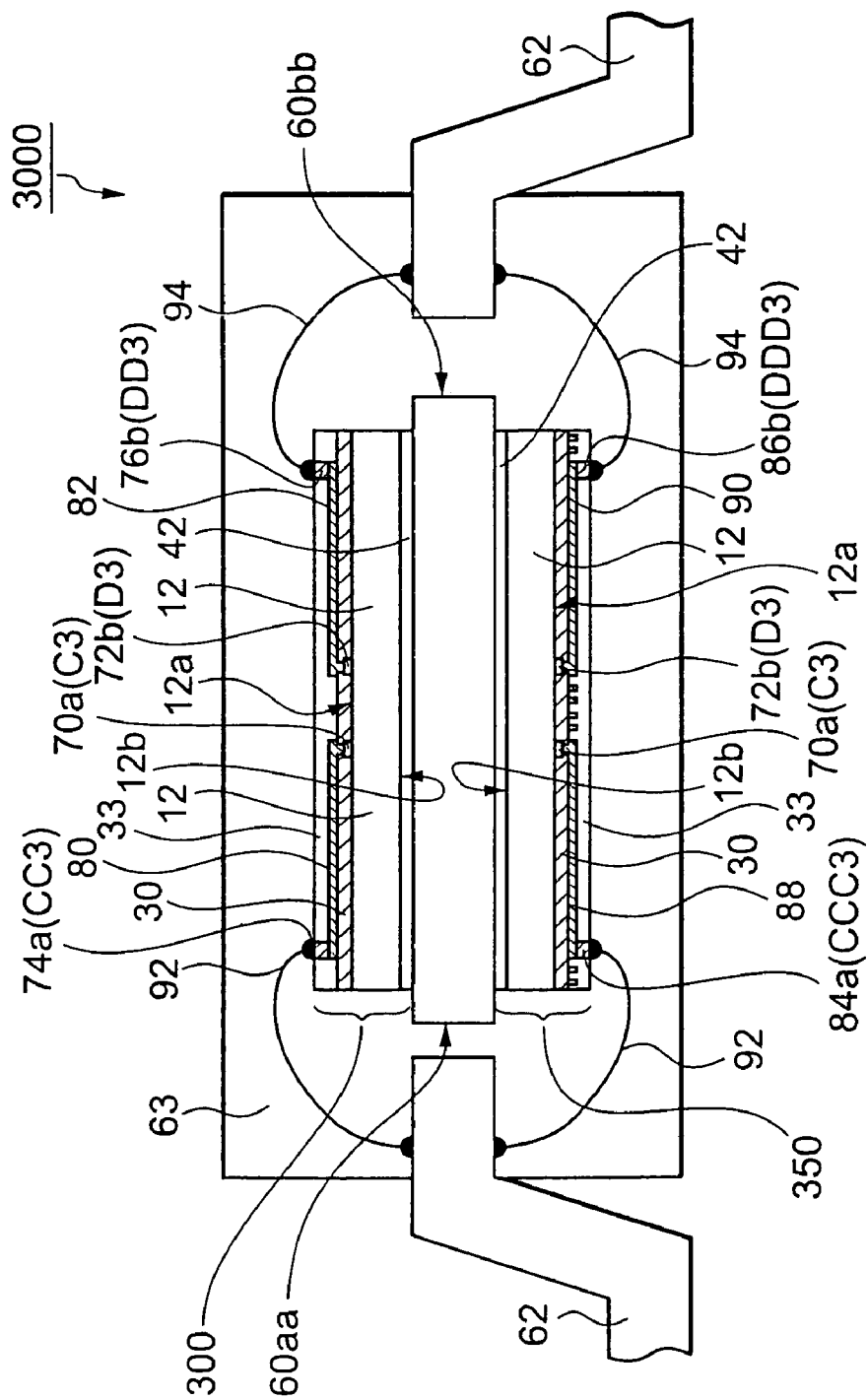
FIG. 12 is a schematic cross-sectional view for describing the multichip package according to the third embodiment of the present invention.

FIGS. 9(A) and 9(B) are respectively plan views schematically showing one configurational examples of a first semiconductor chip package 300 and a second semiconductor chip package 350 according to the present embodiment. FIG. 10(A) is a schematic cross-sectional view showing a cut-away portion obtained by cutting FIG. 9(A) along broken line XA-XA of FIG. 9(A). FIG. 10(B) is a schematic cross-sectional view showing a cut-away portion obtained by cutting FIG. 9(B) along broken line XB-XB of FIG. 9(B). FIG. 11(A) is a perspective view schematically showing one configurational example of a multichip package 3000 according to the present embodiment. FIG. 11(B) is a perspective view of the multichip package 3000 as viewed from its back side. FIG. 12 is a schematic cross-sectional view showing a cut-away portion obtained by cutting FIG. 11(A) along broken line XII-XII of FIG. 11(A).

The present embodiment is principally different from the second embodiment in that electrode pad groups of a pair of semiconductor chip structural bodies identical in structure and function, constituting the multichip package 3000 are interposed between first and second sides and provided on both sides of a virtual line parallel to these sides along the virtual line, and both semiconductor chip structural bodies have package structures.

In the present configurational example, as shown in FIG. 9(A), the first semiconductor chip package 300 will be considered with an area of a main surface 12a of a semiconductor chip 12 being divided into two areas by a line segment lying in the direction normal to the longitudinal direction of the semiconductor chip 12. In such a case, a first electrode pad group 70 and a second electrode pad group 72 are respectively formed along a center line Q in the areas, on both sides of the center line Q corresponding to the virtual line in which the distances from the first side 14a and the second side 14b are equal to each other, of the main surface 12a of the semiconductor chip.

In the present embodiment, a plurality of first electrode pads 70a included in the first electrode pad group 70 are respectively shown with being assigned numbers of C1 to Cn (where n: integers greater than or equal to 2)(n=5 for convenience in the present embodiment: C1, C2, C3, C4 and C5) in order in a first direction (R direction in the drawing) parallel to the center line Q.

A plurality of second electrode pads 72b included in the second electrode pad group 72 are shown with being assigned numbers of D1 to Dn (where n: integers greater than or equal to 2) (n=5 for convenience in the present embodiment: D1, D2, D3, D4 and D5) in order in a second direction (R direction similarly in the figure).

Further, a first bonding pad group (hereinafter might be called simply "first pad group") 74 is provided between the first side 14a and the first electrode pad group 70 along the first side 14a. A plurality of first bonding pads (hereinafter might be called simply "first pads") 74a respectively provided corresponding to the first pads 70a are disposed in the first pad group 74 in alignment along the first side 14a every predetermined intervals, e.g., at the same intervals. At this time, the first pads 74a are respectively shown with being assigned numbers of CC1 to CCn (where n: integer greater than or equal to 2)(n=5 for convenience in the present embodiment: CC1, CC2, CC3, CC4 and CC5) in order in the first direction (R direction in the figure).

A second bonding pad group (hereinafter might be called simply "second pad group") 76 is provided between the second side 14b and the second electrode pad group 72 along the second side 14b. A plurality of second boding pads (hereinafter might be called simply "second pads") 76b respectively provided corresponding to the second electrode pads 72b are disposed in the second pad group 76 in alignment along the second side 14b every predetermined intervals, e.g., at the same intervals. At this time, the second pads 76b are respectively shown with being aligned numbers of DD1 to DDn (where n: integer greater than or equal to 2)(n=5 for convenience in the present embodiment: DD1, DD2, DD3, DD4 and DD5) in order in the second direction.

Then, the Ci (where i: integers from 1 to n)th first electrode pads 70a and the CCi (where i: integers from 1 to n)th first pads 74a are respectively electrically connected by first redistribution wiring layers 80 in a one-to-one correspondence relationship. The Di (where i: integers from 1 to n)th second electrode pads 72b and the DDi (where i: integers from 1 to n)th second pads 76b are respectively electrically connected by second redistribution wiring layers 82 in a one-to-one correspondence relationship.

On the other hand, as shown in FIG. 9(B), the second semiconductor chip package 350 includes first and second electrode pad groups (70 and 72) provided on a main surface 12a of a semiconductor chip 12 in a manner similar to FIG. 9(A). First electrode pads 70a are respectively shown with being assigned numbers of C1 to C5. Also second electrode pads 72b are respectively shown with being assigned numbers of D1 to D5.

Further, a first bonding pad group (hereinafter might be called simply "first pad group") 84 is provided between a first side 14a and the first electrode pad group 70 along the first side 14a. A plurality of first bonding pads (hereinafter might be called simply "first pads") 84a respectively provided corresponding to the first electrode pads 70a are disposed in the first pad group 84 in alignment along the first side 14a every predetermined intervals, e.g., at the same intervals.

In the present embodiment, the n (where n: integer greater than or equal to 2)th to 1st first pads 84a are provided in reverse order in an area between the first side 14a and the first electrode pad group 70 so as to be parallel to the first side 14a and correspond to the respective first electrode pads 70a. That is, the respective first pads 84a are shown with begin assigned numbers of CCC1 to CCCn (where n: integer greater than or equal to 2)(n=5 for convenience in the present embodiment: CCC1, CCC2, CCC3, CCC4 and CCC5) in order from direction opposite to a first direction (R direction in the figure).

A second bonding pad group (hereafter might be called simply "second pad group") 86 is provided between a second side 14b and the second electrode pad group 72 along the second side 14b. A plurality of second bonding pads (hereinafter might be called "second pads") 86b provided corresponding to the respective second electrode pads 72b are disposed in the second pad group 86 in alignment along the second side 14b every predetermined intervals, e.g. at the same intervals.

In the present embodiment, the n (where n: integer greater than or equal to 2)th to 1st second pads 86b are provided in reverse order in an area between the second side 14b and the second electrode pad group 72 so as to be parallel to the second side 14b and correspond to the respective second electrode pads 72b. That is, the respective second pads 86b are shown with begin assigned numbers of DDD1 to DDDn (where n: integer greater than or equal to 2)(n=5 for convenience in the present embodiment: DDD1, DDD2, DDD3, DDD4 and DDD5) in order from the direction opposite to the second direction (R direction similarly in the figure).

Then, the Ci (where i: integers from 1 to n)th first electrode pads 70a and the CCCi (where i: integers from 1 to n)th first pads 84a are respectively electrically connected by first redistribution wiring layers 88 in a one-to-one correspondence relationship. The Di (where i: integers from 1 to n)th second electrode pads 72b and the DDDi (where i: integers from 1 to n)th second pads 86b are respectively electrically connected by second redistribution wiring layers 90 in a one-to-one correspondence relationship.

As shown in FIGS. 10(A) and 10(B), the Ci (where i: integers from 1 to n)th first electrode pads 17a and the Di (wherein i: integers from 1 to n)th second electrode pads 72b respectively electrically connected to internal circuit elements (not shown) are formed on the main surface 12a of the semiconductor chip 12.

In FIG. 10(A), the Ci (where i: integers from 1 to n)th first electrode pads 70a are electrically connected to their corresponding CCi (where i: integers from 1 to n)th first pads 74a assigned as connecting destinations by the first redistribution wiring layers 80 extending from over the first electrode pads 70a to over an insulating film 30. The first pads 74a are respectively provided corresponding to the first electrode pads 70a along the first side 14a.

The Di (where i: integers from 1 to n)th second electrode pads 72b are electrically connected to their corresponding DDi (where i: integers from 1 to n)th second pads 76b assigned as connecting destinations by the second redistribution wiring layers 82 extending from over the second electrode pads 72b to over the insulating film 30.

In FIG. 10(B) as well, the Ci (where i: integers from 1 to n)th first electrode pads 70a are electrically connected to their corresponding CCCi (where i: integers from 1 to n)th first pads 84a assigned as connecting destinations by the second redistribution wiring layers 88 extending from over the first electrode pads 70a to over an insulating film 30.

The Di (where i: integers from 1 to n)th second electrode pads 72b are electrically connected to their corresponding DDDi (where i: integers from 1 to n)th second pads 86b assigned as connecting destinations by the second redistribution wiring layers 90 extending from over the second electrode pads 72b to over the insulating film 30.

Encapsulating layers 33 each made up of an epoxy resin or the like are respectively formed on the upper sides of the main surfaces 12a of the semiconductor chips 12 of the first and second semiconductor chip packages (300 and 350). The encapsulating layers 33 are provided so as to embed the insulating films 30, the first redistribution wiring layers (80 and 88) and the second redistribution wiring layers (82 and 90) or the like therein and expose the top faces of the first and second pads (74a, 84a, 76b and 86b) respectively.

Subsequently, the multichip package 3000 in which the first and second semiconductor chip packages (300 and 350) each having the above-mentioned configuration are laminated, will be explained with reference to FIGS. 11(A) and 11(B) and FIG. 12.

In the multichip package 3000 according to the present embodiment, the first semiconductor chip package 300 is mounted on a rectangular main surface 60a of a die pad 60 having the form of rectangular parallelepiped. On the other hand, the second semiconductor chip package 350 is mounted on a back surface 60b of a die pad 60.

The first and second semiconductor chip packages (300 and 350) are provided in such a manner that back surfaces 12b of the semiconductor chips 12 included in both are placed face to face with one another with the corresponding die pads 60 interposed therebetween, and side faces 14aa containing the first sides 14a are respectively placed in the same direction (Y direction in the figure) (see FIG. 12). Incidentally, an adhesive layer 42 made of a dice bond agent adheres and fixes between the die pad 60 and each of the first and second semiconductor chip packages (300 and 350).

Then, the CCi (where i: integers from 1 to n)th first pads 74a of the first semiconductor chip package 300, and the CCCi (where i: integers from 1 to n)th first pads 84a of the second semiconductor chip package 350 are connected to their corresponding same lead portions 62 by first bonding wires 92.

The DDi (where i: integers from 1 to n)th second pads 76b of the first semiconductor chip package 300 and the DDDi (where i: integers from 1 to n)th second pads 86b of the second semiconductor chip package 350 are connected to their corresponding lead portions 62 by second bonding wires 94.

In the multichip package 3000, as shown in FIG. 12, the first and second semiconductor chip packages (300 and 350) and the first and second bonding wires (92 and 94) respectively mounted over the obverse and reverse sides (60a and 60b) of the die pads 60, and some of the lead portions 62 are principally sealed with a sealing or encapsulating portion 63 made of a mold resin or the like.

According to the present embodiment, an effect similar to the second embodiment can be obtained.

Further, according to the present embodiment, the redistribution wiring layers also serve as the functions of relocating the electrode pads included in the respective semiconductor chip packages in the peripheral edges of the main surfaces of the semiconductor chips. Thus, the wire bonding can be performed simply and reliably.

As described above, the present invention is not limited to only the combinations of the above-mentioned embodiments. Thus, the present invention can be applied by combining suitable conditions at arbitrary and suitable stages.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

Drawings

FIG. 1: Semiconductor Chip Package of First Embodiment
14a: First Side, 14b: Second Side, 16: First Electrode Pad Group, 16a: First Electrode Pad, 17: Second Electrode Pad Group, 17b: Second Electrode Pad, 18: Central Bonding Pad Group, 18a: First Central Bonding Pad, 18b: Second Central Bonding Pad, 20: First Bonding Pad Group, 20a: First Bonding Pad, 22: Second Bonding Pad Group, 22b: Second Bonding Pad, 24: First Redistribution Wiring Layer, 26: Second Redistribution Wiring Layer, 33: Encapsulating Layer, 100: Semiconductor Chip Package FIG. 2: Semiconductor Chip Package of First Embodiment
12: Semiconductor Chip, 12a: Main Surface of Semiconductor Chip, 30: Insulating Film FIG. 3: Multichip Package of First Embodiment
14aa: Side Face of Semiconductor Chip, 40: Substrate, 40a: Mounting Surface of Substrate, 42: Adhesive Layer, 45: Third Bonding Pad, 47: Fourth Bonding Pad, 51: First Bonding Wire, 52: Second Bonding Wire, 53: Third Bonding Wire, 54: Fourth Bonding Wire, 100a: First Semiconductor Chip Package, 100b: Second Semiconductor Chip Package, 110: Laminated Body, 401a: Opposite Area, 402a, 403a: Non-Opposite Areas, 1000: Multichip Package FIG. 4: Multichip Package of First Embodiment
40b: Surface of Substrate, 48: Conductive Contact, 49: External Terminal, 59: Encapsulating Portion FIG. 5: Semiconductor Chip Structural Body and Semiconductor Chip Package According to Second Embodiment
31: First Bonding Pad Group, 31a: First Bonding Pad, 32: Second Bonding Pad Group, 32b: Second Bonding Pad, 34: First Redistribution Wiring Layer, 36: Second Redistribution Wiring Layer, 200: Semiconductor Chip Structural Body, 250: Semiconductor Chip Package FIG. 6: Semiconductor Chip Structural Body and Semiconductor Chip Package According to Second Embodiment
14bb; Side Face of Semiconductor Chip FIG. 7: Multichip Package of Second Embodiment
12b: Back Surface of Semiconductor Chip, 60: Die Pad, 60a: Main Surface of Die Pad, 60aa, 60bb: Side Faces (End Faces) of Die Pads, 60b: Back Surface of Die Pad, 62: Lead Portion, 66: First Bonding Wire, 68: Second Bonding Wire, 2000: Multichip Package FIG. 8: Multichip Package of Second Embodiment
63: Encapsulating Portion FIG. 9: Semiconductor Chip Package of Third Embodiment
70: First Electrode Pad Group, 70a: First Electrode Pad, 72: Second Electrode Pad Group, 72b: Second Electrode Pad, 74, 84: First Bonding Pad Groups, 74a, 84b: First Bonding Pads, 76, 86: Second Bonding Pad Groups, 76b, 86b: Second Bonding Pads, 80, 88: First Redistribution Wiring Layers, 82, 90: Second Redistribution Wiring Layers, 300: First Semiconductor Chip Package, 350: Second Semiconductor Chip Package FIG. 10: Semiconductor Chip Package of Third Embodiment FIG. 11: Multichip Package of Third Embodiment
92: First Bonding Wire, 94: Second Bonding Wire, 3000: Multichip Package FIG. 12: Multichip Package of Third Embodiment

What is claimed is:

1. A multichip package, comprising:
a pair of semiconductor chip structural bodies each including,
a semiconductor chip having a rectangular main surface;
a first electrode pad group provided on the main surface, said first electrode pad group including a plurality of first electrode pads provided in parallel along a first side defining the main surface and provided in order from the 1st to n (where n: integer greater than or equal to 2)th first electrode pads; and
a second electrode pad group provided on the main surface, said second electrode pad group including a plurality of second electrode pads provided in parallel along a second side defining the main surface and opposite to the first side and provided in order from the 1st to n (where n: integer greater than or equal to 2)th second electrode pads,
wherein one of the pair of semiconductor chip structural bodies is configured as a semiconductor chip package, said one further including:
a first bonding pad group including, in an area between the first electrode pad group and the first side, of the main surface, first bonding pads provided parallel to the first side in a reverse order from the n (where n: integer greater than or equal to 2)th to 1st first bonding pads, corresponding to the first electrode pads in parallel to the first side;
a second bonding pad group including, in an area between the second electrode pad group and the second side, of the main surface, second bonding pads provided parallel to the second side in a reverse order from the n (where n: integer greater than or equal to 2)th to 1st second bonding pads, corresponding to the second electrode pads in parallel to the second side;
first redistribution wiring layers that respectively electrically connect the i (where i: integers from 1 to n)th first electrode pads and the i (where i: integers from 1 to n)th first bonding pads;
second redistribution wiring layers that respectively electrically connect the i (where i: integers from 1 to n)th second electrode pads and the i (where i: integers from 1 to n)th second bonding pads; and
an encapsulating layer formed on the main surface with a thickness that causes top faces of the first and second bonding pads to be exposed therefrom respectively,
wherein the pair of semiconductor chip structural bodies are stacked on one another in such a manner that the back surfaces of the semiconductor chips respectively included in the semiconductor chip structural bodies are faced each other and side faces of the semiconductor chips, containing the first sides thereof are faced in the same direction.

2. A multichip package according to claim 1, further including:
a plurality of conductive portions which are respectively provided at positions opposite to the side faces on the respective sides of the first and second sides, of the pair of semiconductor chip structural bodies when the pair of semiconductor chip structural bodies are seen from above on a plane basis, and which extend in the direction normal to the first and second sides,
wherein the i (where i: integers from 1 to n)th first bonding pads on the one semiconductor chip structural body side, and the i (where i: integers from 1 to n)th first electrode pads on the other semiconductor chip structural body side are respectively electrically connected to the respective conductive portions by first bonding wires,
wherein the i (where i: integers from 1 to n)th second bonding pads on the one semiconductor chip structural body side, and the i (where i: integers from 1 to n)th second electrode pads on the other semiconductor chip structural body side are respectively electrically connected to the respective conductive portions by second bonding wires.

3. A multichip package, comprising:
semiconductor chip structural bodies provided in pair, said semiconductor chip structural body including a semiconductor chip having a rectangular main surface, and being provided on the main surface and having a first electrode pad group including a plurality of first electrode pads provided in order from the 1st to n (where n: integer greater than or equal to 2)th first electrode pads, and a second electrode pad group including the 1st to n (where n: integer greater than or equal to 2)th second electrode pads,
wherein the first electrode pad group is provided on the side of the first side along a virtual line lying between first and second sides defining the main surface and opposite to each other and extending in parallel to these sides, and the second electrode pad group is similarly provided along a virtual line towards the second side,
wherein one of the pair of semiconductor chip structural bodies is configured as a semiconductor chip package, said one further including:
a first bonding pad group including, in an area between the first electrode pad group and the first side, of the main surface, a plurality of first bonding pads provided in an order from the 1st to n (where n: integer greater than or equal to 2)th first bonding pads, corresponding to the first electrode pads in a direction parallel to the first side;
a second bonding pad group including, in an area between the second electrode pad group and the second side, of the main surface, a plurality of second bonding pads provided in an order from the 1st to n (where n: integer greater than or equal to 2)th second bonding pads, corresponding to the second electrode pads in a direction parallel to the second side;
first redistribution wiring layers that respectively electrically connect the i (where i: integers from 1 to n)th first electrode pads and the i (where i: integers from 1 to n)th first bonding pads;
second redistribution wiring layers that respectively electrically connect the i (where i: integers from 1 to n)th second electrode pads and the i (where i: integers from 1 to n)th second bonding pads; and
an encapsulating layer formed on the main surface with a thickness that causes top faces of the first and second bonding pads to be exposed therefrom respectively,
wherein the pair of semiconductor chip structural bodies are stacked on one another in such a manner that the back surfaces of the semiconductor chips respectively included in the semiconductor chip structural bodies are faced each other and side faces of the semiconductor chips, containing the first sides thereof are faced in the same direction.

4. A multichip package according to claim 3, wherein the virtual line is set as a center line in which the distances from the first side and the second side'are equal to each other.

5. A multichip package according to claim 3, wherein a plurality of conductive portions which are respectively provided at positions opposite to the side faces on the respective sides of the first and second sides, of the pair of semiconductor chip structural bodies when the pair of semiconductor chip structural bodies are seen from above on a plane basis, and which extend in the direction normal to the first and second sides, wherein the i (where i: integers from 1 to n)th first bonding pads on the one semiconductor chip structural body side, and the i (where i: integers from 1 to n)th first electrode pads on the other semiconductor chip structural body side are respectively electrically connected to the respective conductive portions by first bonding wires, wherein the i (where i: integers from 1 to n)th second bonding pads on the one semiconductor chip structural body side, and the i (where i: integers from 1 to n)th second electrode pads on the other semiconductor chip structural body side are respectively electrically connected to the respective conductive portions by second bonding wires.

* * * * *